(12) United States Patent
Hoffmeyer (10) Patent No.: US 11,774,190 B2
(45) Date of Patent: Oct. 3, 2023

(54) PIERCED THERMAL INTERFACE CONSTRUCTIONS

(71) Applicant: INTERNATIONAL BUSINESS MACHINES CORPORATION, Armonk, NY (US)

(72) Inventor: Mark K. Hoffmeyer, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 654 days.

(21) Appl. No.: 16/847,851

(22) Filed: Apr. 14, 2020

(65) Prior Publication Data

US 2021/0318077 A1 Oct. 14, 2021

(51) Int. Cl.
    *F28F 7/00* (2006.01)
    *F28F 3/04* (2006.01)
    *B23P 15/26* (2006.01)

(52) U.S. Cl.
CPC .............. *F28F 3/042* (2013.01); *B23P 15/26* (2013.01)

(58) Field of Classification Search
CPC ................................. F28F 3/042; B23P 15/26
USPC .......................................................... 165/185
See application file for complete search history.

(56) References Cited

U.S. PATENT DOCUMENTS

| | | | |
|---|---|---|---|
| 5,195,021 A | 3/1993 | Ozmat et al. | |
| 6,245,186 B1 * | 6/2001 | Alcoe | H01L 23/3733 257/E23.09 |
| 6,372,997 B1 | 4/2002 | Hill et al. | |
| 6,391,442 B1 * | 5/2002 | Duvall | F28D 20/02 428/407 |
| 6,461,722 B1 * | 10/2002 | Kittel | B41M 5/38207 428/207 |
| 6,523,608 B1 * | 2/2003 | Solbrekken | H01L 23/3733 361/708 |
| 7,200,006 B2 | 4/2007 | Farrow et al. | |
| 7,269,015 B2 | 9/2007 | Hornung et al. | |
| 7,416,789 B2 * | 8/2008 | Breit | H01L 23/3736 428/614 |
| 7,464,462 B2 * | 12/2008 | Edwards | H01L 23/427 264/642 |
| 7,582,403 B2 | 9/2009 | Bailey et al. | |

(Continued)

FOREIGN PATENT DOCUMENTS

| CN | 102504769 A | 6/2012 |
|---|---|---|
| CN | 102956584 A | 3/2013 |

(Continued)

OTHER PUBLICATIONS

Abawi, "The Bending of Bonded Layers Due to Thermal Stress," Hughes Research Laboratories, Malibu, CA, dated Oct. 23, 2004, 11 pages.

(Continued)

*Primary Examiner* — Claire E Rojohn, III
(74) *Attorney, Agent, or Firm* — Nathan M. Rau (57) ABSTRACT

Pierced thermal interface constructions including a thermal interface material (TIM) structure comprising: a TIM sheet comprising a plurality of piercings, where each of the plurality of piercings comprises a cavity and displaced material, and where the displaced material from each of the plurality of piercings protrudes away from the TIM sheet.

9 Claims, 7 Drawing Sheets

(56) References Cited

U.S. PATENT DOCUMENTS

| | | |
|---|---|---|
| 7,755,184 B2 | 7/2010 | Macris et al. |
| 7,875,972 B2 | 1/2011 | Jadhav et al. |
| 8,389,119 B2 | 3/2013 | Panzer et al. |
| 8,693,200 B2 | 4/2014 | Colgan et al. |
| 8,877,318 B2 * | 11/2014 | Nishikawa ......... H05K 7/20509 |
| | | 361/708 |
| 9,017,808 B2 | 4/2015 | Wang et al. |
| 9,179,579 B2 | 11/2015 | Hada et al. |
| 9,472,485 B2 | 10/2016 | Saeidi et al. |
| 9,609,744 B2 | 3/2017 | Hoffmeyer et al. |
| 9,795,059 B2 * | 10/2017 | Strader ..................... B22F 7/04 |
| 9,826,662 B2 | 11/2017 | Kim et al. |
| 10,182,514 B2 * | 1/2019 | Hoffmeyer ............... G06F 1/20 |
| 10,186,477 B2 | 1/2019 | Gowda et al. |
| 10,566,313 B1 | 2/2020 | Li et al. |
| 10,781,349 B2 | 9/2020 | Zhang et al. |
| 2002/0015288 A1 | 2/2002 | Dibene et al. |
| 2002/0135984 A1 | 9/2002 | Greenwood et al. |
| 2003/0160319 A1 | 8/2003 | Zheng et al. |
| 2004/0118579 A1 | 6/2004 | McCutcheon et al. |
| 2004/0265489 A1 | 12/2004 | Dubin |
| 2005/0248924 A1 | 11/2005 | Farrow et al. |
| 2005/0270744 A1 | 12/2005 | Farrow et al. |
| 2006/0157223 A1 | 7/2006 | Gelorme et al. |
| 2007/0091574 A1 | 4/2007 | Jarrett et al. |
| 2007/0202289 A1 | 8/2007 | Kranz et al. |
| 2008/0165502 A1 | 7/2008 | Furman et al. |
| 2008/0305321 A1 | 12/2008 | Raravikar et al. |
| 2009/0122491 A1 | 5/2009 | Martin et al. |
| 2010/0129648 A1 | 5/2010 | Xu et al. |
| 2010/0187680 A1 | 7/2010 | Otsuka et al. |
| 2010/0328895 A1 | 12/2010 | Bhagwagar et al. |
| 2011/0090650 A1 | 4/2011 | Oda |
| 2013/0160983 A1 | 6/2013 | Zhang et al. |
| 2013/0199752 A1 | 8/2013 | Colgan et al. |
| 2013/0265722 A1 | 10/2013 | Hill et al. |
| 2013/0308274 A1 | 11/2013 | Murdock et al. |
| 2013/0329352 A1 | 12/2013 | Nigen et al. |
| 2014/0070393 A1 | 3/2014 | Bartley et al. |
| 2014/0193658 A1 | 7/2014 | Ross et al. |
| 2014/0264799 A1 | 9/2014 | Gowda et al. |
| 2014/0328024 A1 | 11/2014 | Mataya et al. |
| 2014/0345843 A1 | 11/2014 | Kirkor et al. |
| 2015/0208550 A1 | 7/2015 | Rugg |
| 2015/0305189 A1 | 10/2015 | Strader et al. |
| 2015/0334871 A1 | 11/2015 | Hill et al. |
| 2015/0352806 A1 | 12/2015 | Faotto |
| 2016/0315030 A1 | 10/2016 | Strader et al. |
| 2016/0329261 A1 | 11/2016 | Hung et al. |
| 2017/0006736 A1 * | 1/2017 | Kenna ....................... F28F 3/02 |
| 2017/0294422 A1 | 10/2017 | Solimando et al. |
| 2017/0368795 A1 | 12/2017 | Kutsumizu et al. |
| 2018/0027691 A1 | 1/2018 | Czaplewski et al. |
| 2018/0044480 A1 | 2/2018 | Shen et al. |
| 2019/0267254 A1 * | 8/2019 | Stathakis ................ H01L 21/56 |
| 2020/0058571 A1 | 2/2020 | Wang et al. |
| 2020/0286806 A1 | 9/2020 | Nofen et al. |
| 2020/0307158 A1 | 10/2020 | Sinfield et al. |
| 2020/0343427 A1 | 10/2020 | Breejen et al. |
| 2020/0411411 A1 | 12/2020 | Hoffmeyer et al. |

FOREIGN PATENT DOCUMENTS

| | | |
|---|---|---|
| CN | 203675528 U | 6/2014 |
| CN | 105611812 A | 5/2016 |
| CN | 106067452 A | 11/2016 |
| JP | H05128561 A | 5/1993 |
| TW | 200637475 A | 10/2006 |
| TW | 201425563 A | 7/2014 |
| WO | 2015120773 A1 | 8/2015 |
| WO | 2017172703 A1 | 10/2017 |
| WO | 2018002754 A1 | 1/2018 |

OTHER PUBLICATIONS

Anonymous, "Method for improving TIM adhesion to the IHS surface via mechanical interlocking designs," An IP.com Prior Art Database Technical Disclosure, IP.com No. IPCOM000146345D, IP.com Electronic Publication Date: Feb. 12, 2007, 6 pages.

IBM Appendix P., "List of IBM Patents or Patent Applications to be Treated as Related", Dated Herewith, 2 pages.

International Search Report and Written Opinion, PCT/IB2017/053491, dated Jan. 4, 2018, 9 pages.

Jiang et al., "Highly Flexible and Self-Healable Thermal Interface Material Based on Boron Nitride Nanosheets and a Dual Cross-Linked Hydrogel." ACS Applied Materials & Interfaces, Research Article, American Chemical Society, ACS Publications, dated 2017 (best date available), 7 pages.

Kempers et al., "In Situ Testing of Metal Micro-Textured Thermal Interface Materials in Telecommunications Applications", Journal of Physics: Conference Series, vol. 525, No. 1, 012016, Eurotherm Seminar 102: Thermal Management of Electronics Systems, IOP Publishing, doi:10.1088/1742-6596/525/1/012016, dated Jul. 2014, 11 pages.

U.S. Appl. No. 16/454,370, to Hoffmeyer et al., entitled, "Multi-Layer Thermal Interface Material," assigned to International Business Machines Corporation, 36 pages, filed Jun. 27, 2019.

International Search Report and Written Opinion, PCT/IB2021/052313, dated Jun. 24, 2021, 8 pages.

* cited by examiner

Place A Thermal Interface Material (TIM) Sheet Between An Upper Forming Plate And A Lower Forming Plate, Where The Upper Forming Plate Comprises A Plurality Of Forming Plate Cavities, And Where The Lower Forming Plate Comprises A Plurality Of Forming Plate Piercing Nails 702

Press The Upper Forming Plate To The Lower Forming Plate Creating A Plurality Of Piercings In The TIM Sheet, Where Each Of The Plurality Of Piercings Comprises A Cavity And Displaced Material, And Where The Displaced Material From Each Of The Plurality Of Piercings Protrudes Away From The TIM Sheet
704

FIG. 7

PIERCED THERMAL INTERFACE CONSTRUCTIONS

BACKGROUND

Field of the Invention

The field of the invention is data processing, or, more specifically, methods and system for pierced thermal interface constructions.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

These advances in computer systems have led to the need for more efficient heat management within such complex systems. In order to get the best performance from certain components, particularly central and graphics processing units, heat must quickly and efficiently be removed from these components and nearby areas. Some of these components may have or develop irregular, non-flat surfaces creating gaps between components and heat exchangers. Without good thermal contact between components and heat exchangers, heat is not able to efficiently be removed from the system.

SUMMARY

Pierced thermal interface constructions may include a thermal interface material (TIM) structure comprising: a TIM sheet comprising a plurality of piercings, where each of the plurality of piercings comprises a cavity and displaced material, and where the displaced material from each of the plurality of piercings protrudes away from the TIM sheet.

Advantages provided by such embodiments for pierced thermal interface constructions include filling gaps in irregular, non-flat surfaces between a heat-producing component and a heat exchanger or spreader plate. The piercings provide highly compressible thermal contact at lower loads between a heat-producing component and a heat exchanger or spreader plate without using a different TIMs across a single surface.

In an optional embodiment, the TIM structure includes an additional viscous TIM placed in at least one cavity and guided away from the TIM sheet by the displaced material. This provides the advantage of an additional TIM material to fill the piercings a create additional thermal contact.

In an optional embodiment, the displaced material from each of the plurality of piercings protrudes above and below the TIM sheet. This provides the advantage of increased gap filling capability without additional TIMs.

In an optional embodiment, the displaced material from at least one of the plurality of piercings is attached to at least two sides of the cavity. This provides the advantage of creating greater thermal contact without additional TIMs.

In an optional embodiment, the plurality of piercings include at least two different sized cavities. This provides the advantage of tailoring the piercing for the requirements of the gaps to be filled by creating a piercing size appropriate for the size of the gap even within the same TIM sheet.

In an optional embodiment, at least one portion of the TIM sheet is without piercings. This provides the advantage of using a single TIM sheet in a location where one portion of the distance between the heat-producing component and a heat exchanger or spreader plate requires only the width of an unpierced TIM sheet while using the same TIM sheet for thermal contact within gaps between the same elements.

Pierced thermal interface constructions may include a system comprising: a heat-generating electronic component comprising a non-flat surface; a heat exchanger positioned on the electronic component along the non-flat surface, where a gap exists between the heat exchanger and electronic component, and where the gap is a portion of the non-flat surface of the electronic component that is separated from the heat exchanger by a greater distance than at least one other portion of the non-flat surface; and a thermal interface material (TIM) sheet placed between the electronic component and the heat exchanger, the TIM sheet comprising a plurality of piercings positioned in the gap between the heat exchanger and electronic component, where each of the plurality of piercings comprise a cavity and displaced material protruding away from the TIM sheet.

Advantages provided by such embodiments for pierced thermal interface constructions include filling gaps in irregular, non-flat surfaces between a heat-producing component and a heat exchanger. The piercings provide highly compressible thermal contact at lower loads between a heat-producing component and a heat exchanger without using a different TIMs across a single surface.

Pierced thermal interface constructions may include a method comprising placing a thermal interface material (TIM) sheet between an upper forming plate and a lower forming plate, where the upper forming plate comprises a plurality of forming plate cavities, and where the lower forming plate comprises a plurality of forming plate piercing nails; and pressing the upper forming plate to the lower forming plate creating a plurality of piercings in the TIM sheet, where each of the plurality of piercings comprises a cavity and displaced material, and where the displaced material from each of the plurality of piercings protrudes away from the TIM sheet.

Advantages provided by such embodiments for pierced thermal interface constructions include an efficient method for creating a TIM sheet for filling gaps in irregular, non-flat surfaces between a heat-producing component and a heat exchanger.

The foregoing and other objects, features and advantages of the invention will be apparent from the following more particular descriptions of exemplary embodiments of the invention as illustrated in the accompanying drawings where like reference numbers generally represent like parts of exemplary embodiments of the invention.

DETAILED DESCRIPTION

Figure 1:
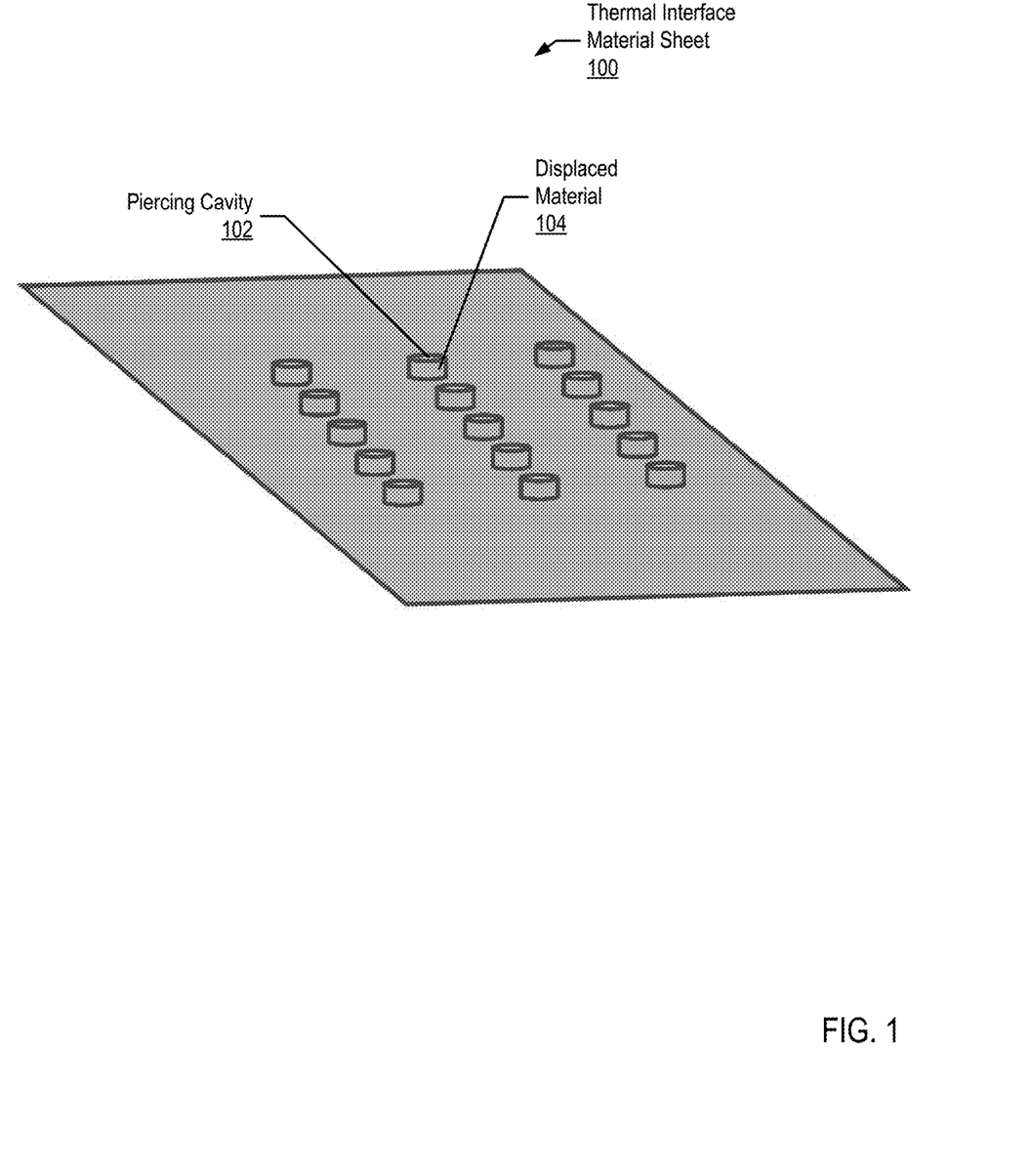
FIG. 1 sets forth a diagram depicting an example thermal interface material (TIM) sheet as a pierced thermal interface construction according to embodiments of the present invention.

Exemplary methods, apparatus, and products for pierced thermal interface constructions in accordance with the present invention are described with reference to the accompanying drawings, beginning with FIG. 1. FIG. 1 sets forth a diagram depicting an example thermal interface material (TIM) sheet as a pierced thermal interface construction according to embodiments of the present invention. As shown in FIG. 1, the TIM sheet (100) includes a plurality of piercings. Each piercing includes a piercing cavity (102) and displaced material (104).

The TIM sheet (100) is a single, continuous sheet or pad of thermal conducting material. The TIM sheet may be a single material type, such as a graphite TIM sheet. Alternatively, the TIM sheet may be a composite material, such as a silicone and acrylate matrix TIM sheets. The TIM sheet (100) may include carbon particles, platelet fiber, nanotubes, metal particles, or ceramic metal oxide particles including, but not limited to, thermally conductive ceramic particles such as aluminum nitride, boron nitride, zinc oxide, and aluminum oxide. Further, the TIM sheet may be compressible in that as pressure is applied to the TIM sheet, the thickness of the TIM sheet may be reduced.

The displaced material (104) is TIM sheet material displaced (i.e., moved) during the creation of the piercing and piercing cavity (102). The displaced material (104) is moved away from the TIM sheet (100). In the example of FIG. 1, the displace material (104) is moved in a direction substantially perpendicular to the plane created by the TIM sheet. Further, as shown in the example, the displaced material of each piercing is moved in the same direction (e.g., above the TIM sheet).

The pierced TIM sheet (100) depicted in FIG. 1 has the advantage of filling gaps in irregular, non-flat surfaces between a heat-producing component and a heat exchanger or spreader plate. The piercings provide highly compressible thermal contact at lower loads between a heat-producing component and a heat exchanger or spreader plate without using a different TIMs across a single surface.

Different ways in which the TIM sheet (100) is pierced may result in different physical relationships between the cavity (102) and displaced material (104). The displaced material (104) may be attached to a single side of the cavity (102), resembling a rectangular, triangular, or round door with a single hinge attaching the door to the cavity (102). Similarly, the displaced material (104) may be attached to two sides of the cavity (102), resembling a rectangular, triangular, or circular double-door with a hinge on two sides of the cavity (102). As another example, the displaced material (104) may be a group of triangles each attached to a section of the cavity (102). A pierced TIM sheet (100) in which at least one of the plurality of piercings is attached to at least two sides of the cavity has advantage of creating greater thermal contact (relative to an unpierced TIM) with elements above and below the pierced TIM sheet without requiring additional TIMs.

Although the example of FIG. 1 depicts only a single sized cavity (102), other embodiments may include two or more different sized cavities (102). Groups of cavities (102) may be different sizes with different shapes of displaced material (104). Differently sized cavities (102) provides the advantage of tailoring the piercing for the requirements of the gaps to be filled by creating a piercing size appropriate for the size of the gap even within the same TIM sheet.

Although the example of FIG. 1 depicts the displaced material (104) from each piercing protruding above the TIM sheet (100), other embodiments may include displaced material (104) protruding above and below the TIM sheet (100). Creating piercings with displaced material (104) protruding above and below the TIM sheet (100) has the advantage of increasing the gap-filling capabilities of the TIM sheet (100) by having twice the height of displaced material (104) to make thermal contact with an electronic component and heat exchanger.

The piercings of the TIM sheet (100) may be made in a wide variety of patterns. Further, at least one portion of the TIM sheet (100) may include no piercings. Such portions of the TIM sheet (100) may be used between elements in direct thermal contact or with minimal gap sizes. Advantages of including portions of the TIM sheet (100) without piercings increases the functionality of a single TIM sheet (100) as the same TIM sheet (100) may be used in narrow and wider gaps.

Figure 2:
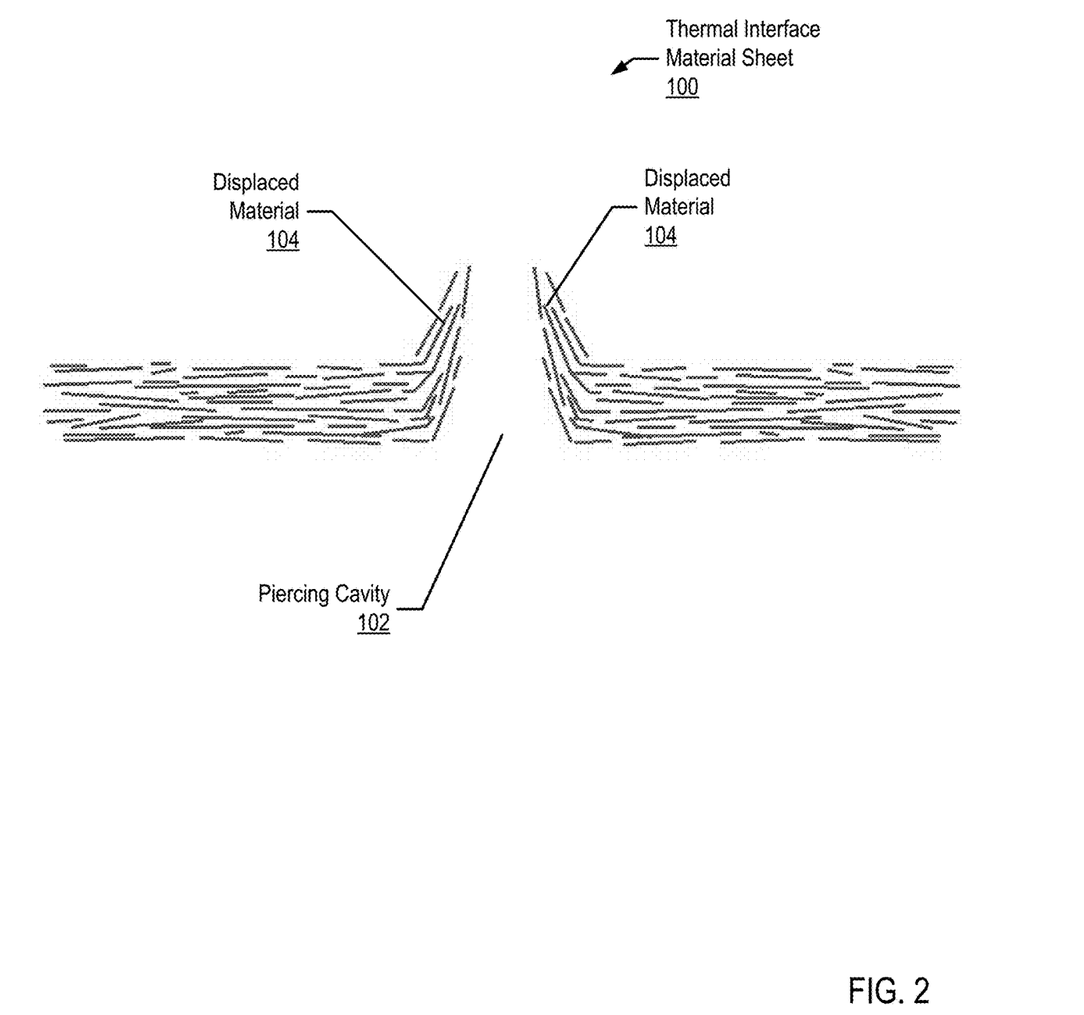
FIG. 2 sets forth an additional diagram depicting a portion of an example TIM sheet as a pierced thermal interface construction according to embodiments of the present invention.

FIG. 2 sets forth an additional diagram depicting a portion of an example TIM sheet as a pierced thermal interface construction according to embodiments of the present invention. Specifically, FIG. 2 shows an enlarged view of a single piercing on a TIM sheet (100). As shown in FIG. 2, the TIM sheet (100) includes a piercing cavity (102) with displaced material (104) on two sides of the cavity (102).

FIG. 2 also illustrates that the fibers, particles, or tubes may be oriented substantially parallel with the plane of the TIM sheet (100). This orientation results in different thermal conductivity along the TIM sheet (100) (i.e., in the direction of the fibers) than perpendicular to the TIM sheet (100) (i.e., perpendicular to the direction of the fibers). For example, the thermal conductivity in the x-y direction may be 1900 watts per meter-kelvin (W/mK), while the thermal conductivity in the z direction may be 20 W/mK.

By creating a piercing in the TIM sheet (100), the direction of the thermal conductivity of the TIM sheet (100) is altered. Specifically, an element in thermal contact with the displaced material (104) conducts heat toward the TIM sheet (100) more efficiently than an element in thermal contact with an unpierced portion of the TIM sheet. This is because the direction of higher thermal conductivity is altered by the piercing and displaced material (104).

Figure 3:
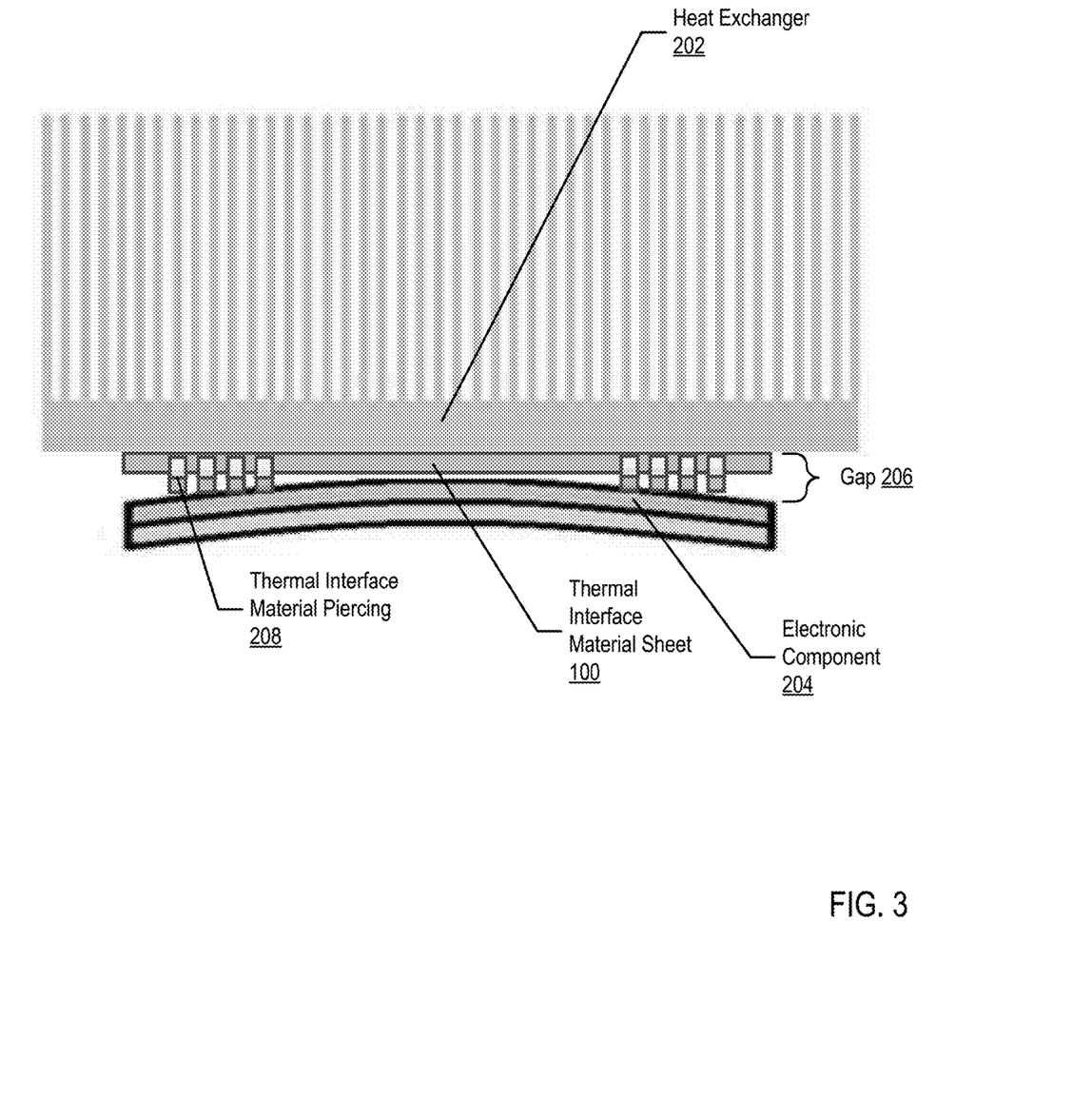
FIG. 3 sets forth a diagram depicting an example system with pierced thermal interface construction according to embodiments of the present invention.

FIG. 3 sets forth a diagram depicting an example system with pierced thermal interface construction according to embodiments of the present invention. As shown in FIG. 3, the system includes a TIM sheet (100) between a heat exchanger (202) and an electronic component (204). The electronic component (204) has warped such that the edges are lower than the center of the electronic component (204) creating a gap (206) on either side. Within the gaps (206) are TIM piercings (208).

The electronic component (204) is an element that generates heat from operation. The electronic component (204) may be a central or graphics processing unit. The heat exchanger (202) is a mechanism, such as a cold plate, that transfers heat from an electronic component (204) to a fluid medium and dissipated. The heat exchanger (200) may be a liquid or air cooled.

As shown in FIG. 3, the TIM piercings (208) have been made in the TIM sheet (100) in locations corresponding to the gaps (206) between the heat exchanger (202) and an electronic component (204). The displaced material of the piercings (208) make thermal contact with the electronic component (204). Without the piercings (208), there would be no thermal contact between the electronic component (204) and the TIM sheet (100).

The portions of the TIM sheet (100) without piercings is placed at a portion of the electronic component (204) that is separated from the heat exchanger (202) by a small distance relative to the gap (206). This provides the advantage of using a single TIM sheet in a location where one portion of the distance between the heat-producing component and a heat exchanger or spreader plate requires only the width of an unpierced TIM sheet while using the same TIM sheet (100) for thermal contact within gaps (206) between the same elements.

The TIM sheet (100) may be accompanied by an additional viscous TIM (such as a thermal grease or paste including phase change materials with conductive filler particle additions) placed adjacent to the TIM sheet (100). As the viscous TIM and TIM sheet (100) are compressed together, the piercings (208) guide the viscous TIM through the cavity and along the displaced material away from the TIM sheet (100). This provides the advantage of an additional TIM material to fill the piercings a create additional thermal contact.

If the electronic component (204) warps further as time passes, the pierced TIM sheet (100) may be replaced by a different TIM sheet that includes a different pattern and/or configuration of piercings.

Figure 4:
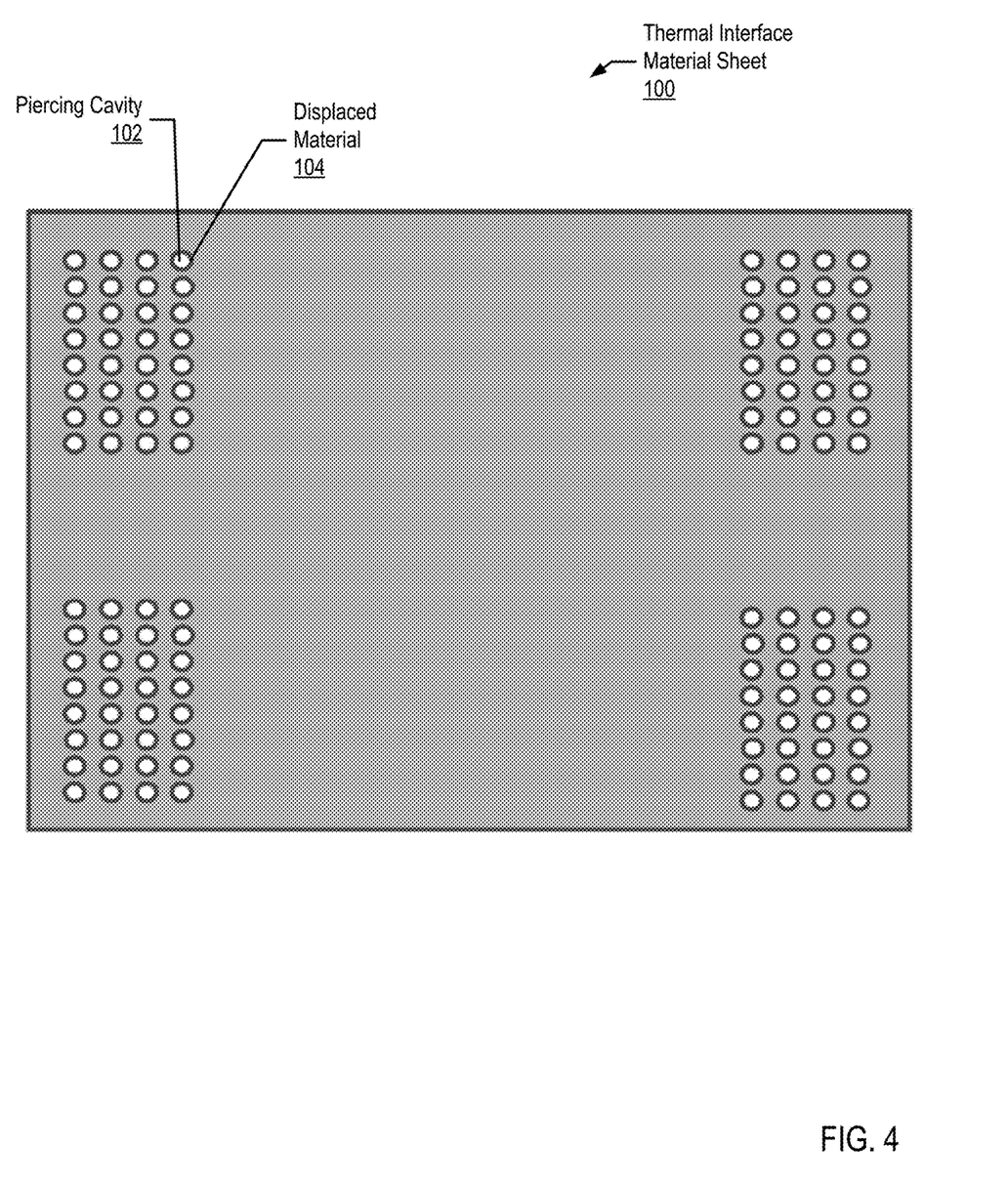
FIG. 4 sets forth a diagram depicting an example TIM sheet pattern as a pierced thermal interface construction according to embodiments of the present invention.
Figure 5:
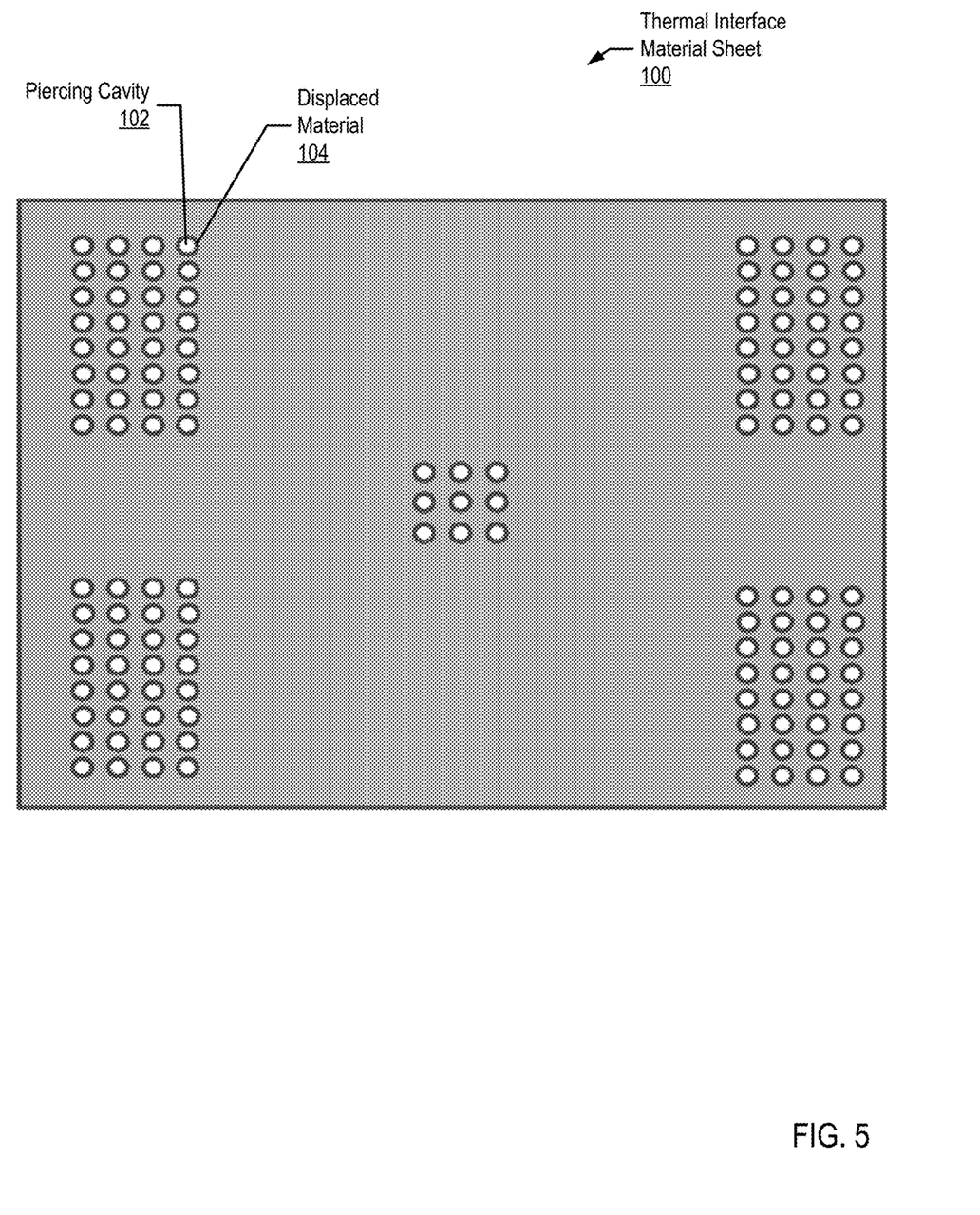
FIG. 5 sets forth a diagram depicting an additional example TIM sheet pattern as a pierced thermal interface construction according to embodiments of the present invention.

FIG. 4 and FIG. 5 sets forth diagrams depicting examples TIM sheet patterns as a pierced thermal interface construction according to embodiments of the present invention. FIG. 4 depicts a TIM sheet (100) in which patterns of piercings have been made in the corners of the TIM sheet (100). FIG. 5 depicts a TIM sheet (100) with an additional arrangement of piercings in the center of the TIM sheet (100).

Figure 6:
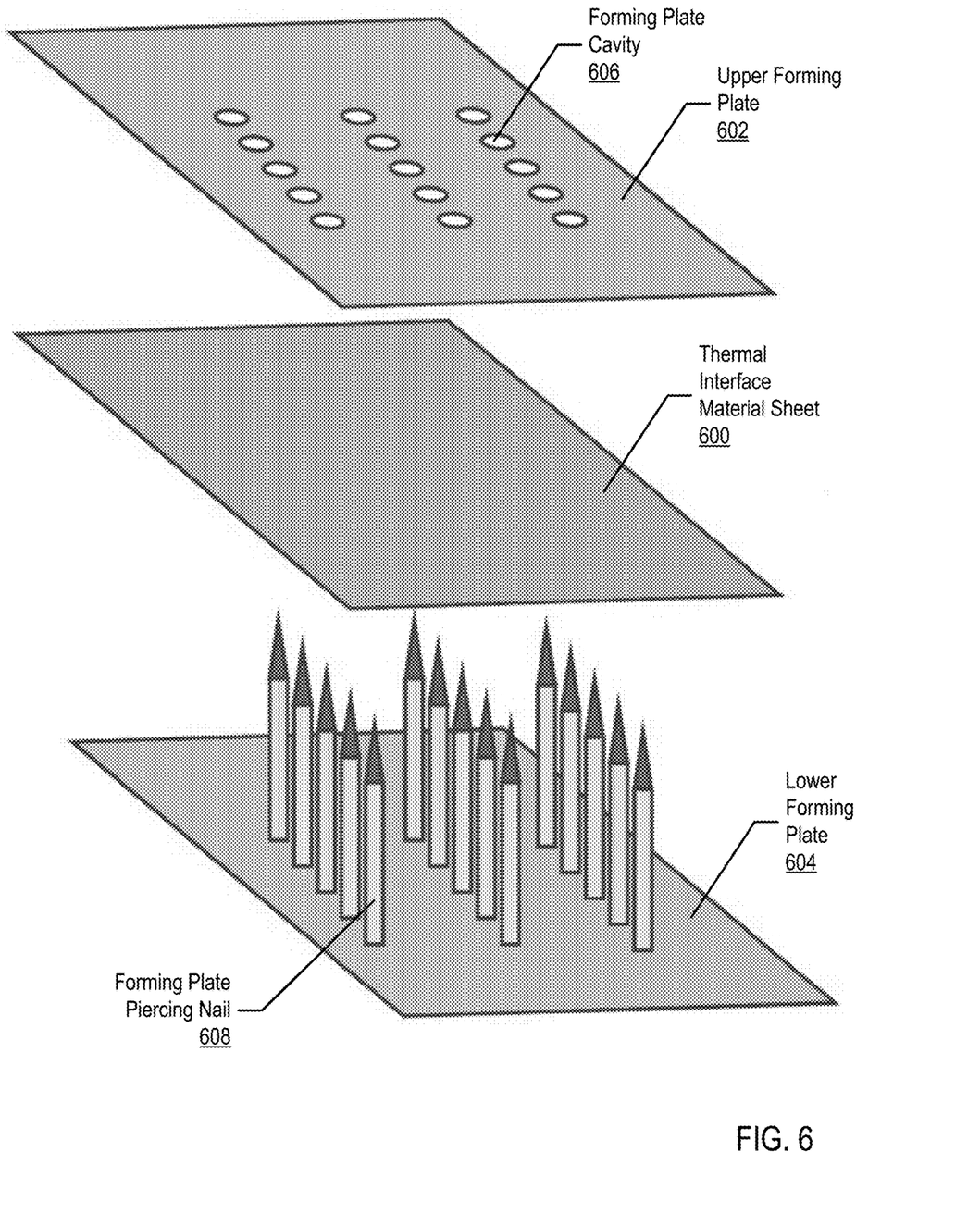
FIG. 6 sets forth an example system for creating a TIM sheet as a pierced thermal interface construction according to embodiments of the present invention.

FIG. 6 sets forth an example system for creating a TIM sheet as a pierced thermal interface construction according to embodiments of the present invention. Specifically, FIG. 6 depicts a forming tool that includes an upper forming plate (602) and a lower forming plate (604). The upper forming plate (602) includes a group of forming plate cavities (606) corresponding to the group of forming plate piercing nails (608) on the lower forming plate (604). Although FIG. 6 depicts the forming plate piercing nails (608) as uniform and cylindrical, the forming plate piercing nails (608) may be a variety of shapes and sizes. Such variations may be used to create different types of displaced material, such as those discussed above.

A TIM sheet (600) is placed between the upper forming plate (602) and the lower forming plate (604). The upper forming plate (602) and the lower forming plate (604) are pressed together to drive the forming plate piercing nails (608) through the TIM sheet (600) and through the corresponding forming plate cavities (606). The forming plate cavities (606) may shape the displaced material of the cavity as the forming plate piercing nails (608) pass through. The system may optionally include forming plate piercing nails attached to the upper forming plate (602) toward the lower forming plate (604) with corresponding forming plate cavities in the lower forming plate (604). Such a system may be used to create piercings with displaced material protruding above and below the TIM sheet (600).

Figure 7:
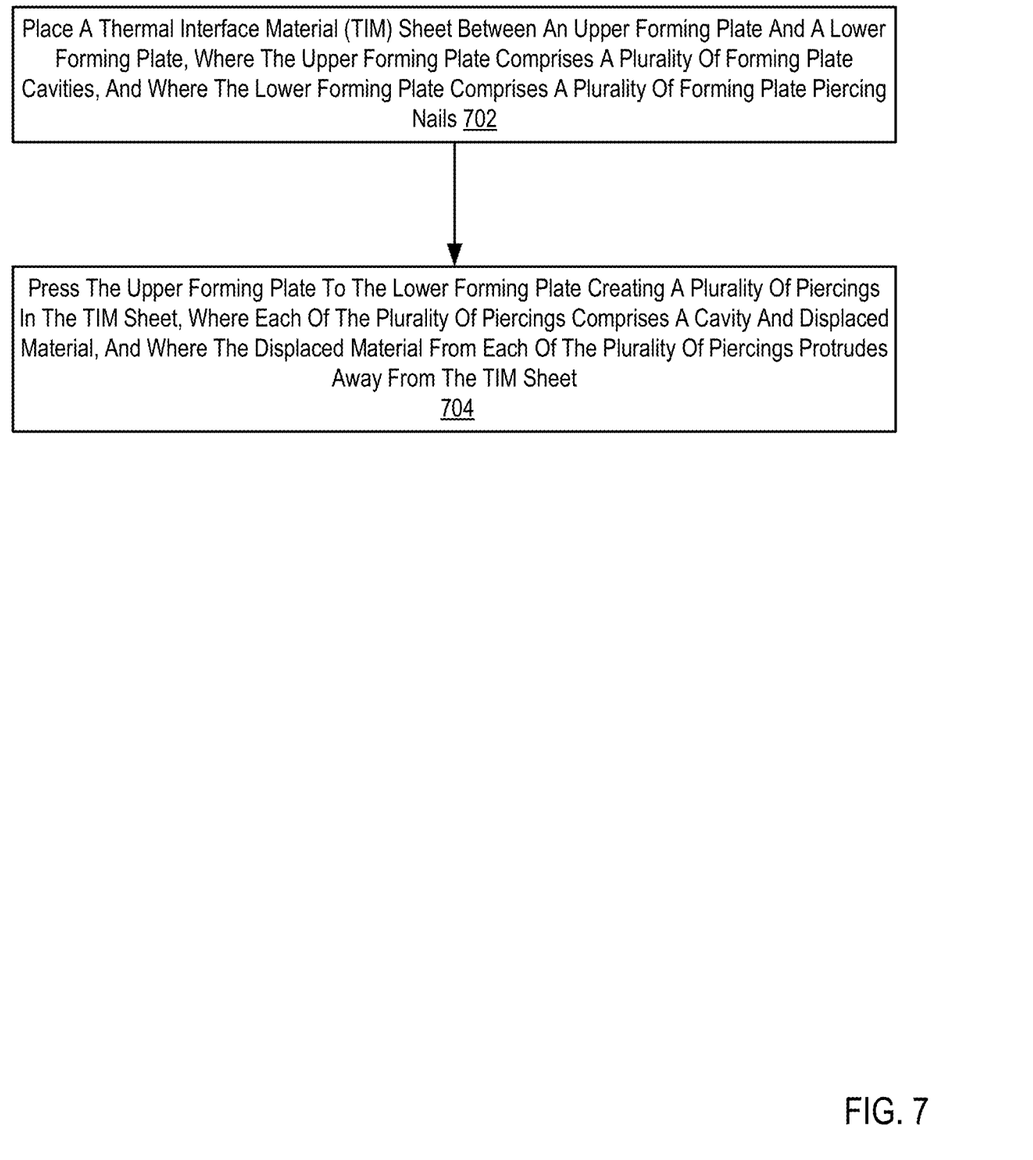
FIG. 7 sets forth a flow chart illustrating an exemplary method for creating pierced thermal interface constructions according to embodiments of the present invention.

FIG. 7 sets forth a flow chart illustrating an exemplary method for creating pierced thermal interface constructions according to embodiments of the present invention. The method of FIG. 7 includes placing (702) a thermal interface material (TIM) sheet between an upper forming plate and a lower forming plate, wherein the upper forming plate comprises a plurality of forming plate cavities, and wherein the lower forming plate comprises a plurality of forming plate piercing nails; and pressing (704) the upper forming plate to the lower forming plate creating a plurality of piercings in the TIM sheet, wherein each of the plurality of piercings comprises a cavity and displaced material, and wherein the displaced material from each of the plurality of piercings protrudes away from the TIM sheet.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A system comprising:
   a heat-generating electronic component comprising a non-flat surface;
   a heat exchanger positioned on the electronic component along the non-flat surface, wherein a gap exists between the heat exchanger and the electronic component, and wherein the gap is a portion of the non-flat surface of the electronic component that is separated from the heat exchanger by a greater distance than at least one other portion of the non-flat surface; and
   a thermal interface material (TIM) sheet placed between the electronic component and the heat exchanger, the TIM sheet comprising a plurality of piercings positioned in the gap between the heat exchanger and the electronic component, wherein each of the plurality of piercings comprise a cavity and displaced material protruding away from the TIM sheet.

2. The system of claim 1, further comprising:
   a viscous TIM placed in at least one cavity and guided away from the TIM sheet by the displaced material.

3. The system of claim 1, wherein the TIM sheet is without piercings at a portion of the non-flat surface of the electronic component separated from the heat exchanger by a smaller distance than the gap.

4. The system of claim 1, wherein the plurality of piercings alter a thermal conductivity direction of the TIM sheet.

5. The system of claim 1, wherein the displaced material from each of the plurality of piercings protrudes above and below the TIM sheet.

6. The system of claim 1, wherein the displaced material from at least one of the plurality of piercings is attached to at least two sides of the cavity.

7. The system of claim 1, wherein the plurality of piercings include at least two different sized cavities.

8. The system of claim 1, wherein a portion of the TIM sheet is placed between the electronic component and the heat exchanger within the gap.

9. The system of claim 8, wherein the plurality of piercings of the TIM sheet are positioned only at the portion of the TIM sheet that is within the gap between the heat exchanger and the electronic component.

* * * * *